United States Patent [19]

Ruckert et al.

[11] Patent Number: 5,015,554
[45] Date of Patent: May 14, 1991

[54] POSITIVE RADIATION-SENSITIVE MIXTURE

[75] Inventors: Hans Ruckert; Gabriele Lambert, both of Wiesbaden, Fed. Rep. of Germany

[73] Assignee: Hoechst Aktiengesellschaft, Frankfurt am Main, Fed. Rep. of Germany

[21] Appl. No.: 563,677

[22] Filed: Aug. 6, 1990

Related U.S. Application Data

[63] Continuation of Ser. No. 227,121, Aug. 2, 1988, abandoned.

Foreign Application Priority Data

Aug. 4, 1987 [DE] Fed. Rep. of Germany ....... 3725741

[51] Int. Cl.$^5$ ...................... G03C 7/037; G03C 7/30
[52] U.S. Cl. ..................... 430/270; 430/188; 430/192; 430/176; 430/326
[58] Field of Search .............. 430/270, 188, 192, 176, 430/326

[56] References Cited

U.S. PATENT DOCUMENTS

| | | | |
|---|---|---|---|
| 3,515,552 | 6/1970 | Smith et al. | 96/35.1 |
| 3,536,489 | 10/1970 | Smith et al. | 96/28 |
| 3,779,778 | 12/1973 | Smith et al. | 96/115 R |
| 3,954,475 | 5/1976 | Bonham et al. | 96/67 |
| 4,101,323 | 7/1978 | Buhr et al. | 96/35 |
| 4,189,323 | 2/1980 | Buhr | 430/281 |
| 4,247,611 | 1/1981 | Sander et al. | 430/286 |
| 4,248,957 | 2/1981 | Sander et al. | 430/270 |
| 4,250,247 | 2/1981 | Sander et al. | 430/270 |
| 4,294,909 | 10/1981 | Lee | 430/270 X |
| 4,311,782 | 1/1982 | Buhr et al. | 430/270 |
| 4,457,999 | 7/1984 | Stahlhofen | 430/270 X |
| 4,458,000 | 7/1984 | Stahlhofen | 430/270 X |
| 4,506,003 | 3/1985 | Ruckert et al. | 430/270 |
| 4,506,006 | 3/1985 | Ruckert | 430/270 X |

FOREIGN PATENT DOCUMENTS

| | | |
|---|---|---|
| 0082463 | 6/1983 | European Pat. Off. . |
| 0224161 | 6/1987 | European Pat. Off. . |
| 2243621 | 3/1973 | Fed. Rep. of Germany . |
| 2610842 | 9/1976 | Fed. Rep. of Germany . |
| 1154749 | 6/1969 | United Kingdom . |

*Primary Examiner*—Cynthia Hamilton
*Attorney, Agent, or Firm*—Foley & Lardner

[57] ABSTRACT

A radiation-sensitive mixture is described comprising a compound which produces a strong acid under the action of actinic radiation, a binder which is insoluble in water, but soluble in organic solvents and aqueous-alkaline solutions, and a compound of either of formulae I and II

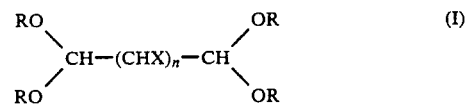

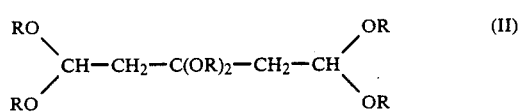

wherein
R denotes a substituted or unsubstituted alkyl group,
X denotes a hydrogen or halogen atom or a hydroxyl, alkyl, alkoxy, alkoxycarbonyl, aryloxy or aryl group, and
n denotes zero or a number from 1 to 3.

The mixture is suitable for the production of printing plates and photoresists and is distinguished by improved high flexibility along with good overdevelopment resistance.

21 Claims, No Drawings

POSITIVE RADIATION-SENSITIVE MIXTURE

This application is a continuation of application Ser. No. 227,121, filed Aug. 2, 1988.

BACKGROUND OF THE INVENTION

The present invention relates to positive, i.e., radiation-solubilized, radiation-sensitive mixtures suitable for the production of photoresists, electronic components and printing plates and for chemical milling. More particularly, it relates to radiation-sensitive mixtures which contain, (a) a compound which forms a strong acid on irradiation, (b) a compound containing at least one acid-cleavable C-O-C bond and (c) a binder which is insoluble in water and soluble in aqueous-alkaline solutions, Mixtures of the compositions mentioned are described, for example, in U.S. Pat. Nos. 3,779,778; 4,101,323; and 4,189,323; in German Offenlegungsschriften Nos. 2,718,254; 2,928,636; and 3,151,078, and in European Patent Application Nos. 0,006,626; 0,006,627; 0,022,571 and 0,042,562.

On exposure of these materials, photolysis of compound (a) forms an acid which causes cleavage of C—O—C bonds of compound (b), meaning that the exposed areas of the photosensitive coatings become soluble in the developer. However, these mixtures are not free of disadvantages.

The polyacetals and polyorthoesters preferred hitherto are in some cases not readily accessible and/or have the property—depending on the condensation conditions—of being produced in various molecular weight distributions. This influences both the production costs and the copying properties desired, in particular the constancy of photosensitivity of photosensitive coatings produced therefrom. These known photosensitive mixtures can only contain a certain amount of acid-cleavable compounds; the major component they contain is generally a binder that is insoluble in water but soluble in aqueous alkalis, which gives the mixture adequate overdevelopment resistance However, this large proportion of alkali-soluble binder, preferably phenolic resin, has the effect that, in particular at relatively great coating thicknesses, coatings of the mixture are relatively brittle and tend to crack or splinter.

The opinion prevailing hitherto was that, for good image differentiation, the greatest possible number of cleavable C—O—C bonds must be present, i.e. polymeric compounds, whereby the C—O—C bonds are preferably in the main chain of the polymer, so that many small, essentially more soluble fragments are formed from one polymer molecule.

SUMMARY OF THE INVENTION

It is therefore an object of the present invention to provide a radiation-sensitive mixture based on acid-cleavable compounds having high radiation sensitivity, which mixture forms coatings of better flexibility and has good overdevelopment resistance.

In accordance with these and other objects of the invention, a radiation-sensitive mixture is provided comprising, (a) a compound which produces a strong acid under the action of actinic radiation, (b) an acetal, and (c) a binder that is insoluble in water and soluble in organic solvents and aqueous-alkaline solutions, wherein the acetal is a compound represented by either of formulae I and II

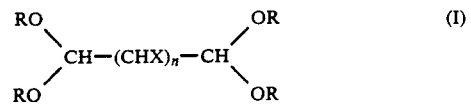

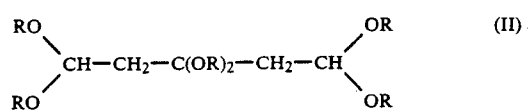

wherein

R denotes a substituted or unsubstituted alkyl group,

X denotes a hydrogen or halogen atom or a hydroxyl, alkyl, alkoxy, alkoxycarbonyl, aryloxy or aryl group, and n denotes zero or a number from 1 to 3.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the context of this description, actinic radiation means any radiation whose energy corresponds at least to that of short-wave visible light. In particular, long-wave UV radiation, but also electron, X-ray and laser radiation, are suitable.

Liquid developers mean, in particular, slightly alkaline aqueous solutions, optionally mixed with organic solvents.

The tetraacetals of formula I are derived from dialdehydes and monoalcohols, preferably primary alcohols. Suitable alcohols ROH are those in which R is alkyl, alkoxyalkyl, arylalkyl, aryloxyalkyl and polyalkoxy alkyl. R generally has from 1 to 20, and preferably from 2 to 10, carbon atoms. Examples of suitable alcohols are 2-ethyl butanol, 2-n-butoxy ethanol, benzyl alcohol, 2-phenoxy ethanol and 2-(2-n-butoxy ethoxy)ethanol.

In formula I, n is preferably 1 or 2, in particular 1. In all CHX groups, X may be a substituent other than hydrogen, but it is preferred that not more than one X in the molecule is other than hydrogen. Preferred substituents X are halogen atoms, in particular chlorine or bromine, hydroxyl groups and alkyl groups having from 1 to 3 carbon atoms.

Individual simple representatives of the compounds of formulae I and II are known, but others, in particular the acetals of alcohols having 3 and more carbon atoms, have not been described hitherto.

The novel cleavable tetraacetals of formula I can be prepared rapidly, simply and inexpensively by transacetylation of commercial tetramethyl or tetraethyl acetals and commercial alcohols. If the preferred 1,1,3,3-tetramethoxypropane (malonaldehyde tetramethyl acetal) is used, even the purity of the technical grade product is adequate. On heating the components with a slight excess of alcohol in the presence of an acid catalyst, such as toluenesulfonic acid, or advantageously in the presence of a montmorillonite ion exchanger, for example K 10 from Suedchemie, which can be filtered off when the transacetalization is complete, methanol is distilled off continuously. Towards the end of the transacetalization, the methanol which remains, and then, in vacuo, the excess of the starting components, are removed by distillation, expediently using a fractionating column. The products obtained can usually be distilled in analytical purity in an oil pump vacuum, which indicates complete transacetalization to the tetraacetal. In general, the product purity is monitored by gas chromatography.

Applicational comparison showed that there is no significant difference in the copying properties between the distilled final product and the crude product obtained after removal of the methanol and the starting components by distillation; the crude product remaining in the flask has, in most cases, merely a darker color. If only three methyl ether groups are replaced by the alcohol component employed, the properties of a mixed acetal of this type differ from those of the tetramethyl acetal.

Furthermore, it has been shown that the optimum proportion of cleavable substance in the mixture according to the invention, and thus the achievable differentiation between the exposed and nonexposed areas of the coating, is considerably dependent on the alcohol component used, in particular its size and hydrophilia, and on the interaction with the binder.

The effect of the structure of the dialdehyde component is analogous. The derivatives of malonaldehyde are generally regarded as the most favourable and are therefore preferred. The probable reason why they are better in degree than the other aldehydes is the following: During the acetal cleavage in the coating, 4 molecules of the alcohol component and 1 molecule of malonaldehyde are produced per acetal molecule. During aqueous-alkaline development, the malonaldehyde, as an enol aldehyde, can form a readily soluble salt and thereby make a significant contribution to image differentiation.

The ideal proportion of acetal in the mixture according to the invention is higher overall, i.e. usually about 30-40%, compared with about 15-25% in the known oligomeric or polymeric cleavable compounds. This may likewise have a favorable effect on the solubility difference between the exposed and unexposed areas and can influence the mechanical properties of the coating. Thus, for example in the case of dry resists, brittleness is reduced and flexibility is improved. The ideal amount for compound 5 (Table 1) is about 40-45%, relative to the solids content.

A general feature of the mixtures according to the invention is that, of the cleavage products after exposure, it is not only the alcohol components, but also the carbonyl components which contribute to the ease of development in the aqueous-alkaline developer, since they are readily water-soluble as enols and their salts. The lower members of this homologous series, glyoxal and malonaldehyde, are already water-soluble, and the ease of enolization decreases with increasing chain length, so that, of the compounds of formula I, those where n=1 are preferred. The ease of enolization is obviously not significantly affected by substituents X. The malonaldehyde compounds which are no longer water soluble dissolve in aqueous alkalis.

These compounds and their acetals are prepared analogously to known procedures. Thus, bromomalonaldehyde can be prepared by bromination of tetramethoxypropane and hydrolysis (*Chem. Ber.* 95: 803 (1962)) and purified by dissolution in dilute sodium hydroxide solution and precipitation using hydrochloric acid. Other halodialdehydes and the associated acetals are described in Houben-Weyl VI/1d, p. 34; *Angew. Chem.* 87 (1985): 124; *Annalen* 481: 17. The synthesis of the alkyl-, phenyl-, alkoxy- and ethoxycarbonylmalonaldehydes and of some other aldehydes and their acetals takes place by the methods given in Houben-Weyl VI/1d, p. 35, *Chem. Ber.* 92: 1921 (1959); *Chem. Ber.* 95: 807 (1962); and *J. Chem. Soc.* 1951: 2482. Methyl diformyl acetate (2-methoxycarbonylmalonaldehyde) is obtained by the method of *J. Am. Chem. Soc.* 95: 543 (1973). Processes for the preparation of acetals are described in detail in Houben-Weyl 7/1, 417, 6/3, 220 and Synthesis 1981: 501; preparation by the more recent trithiane method is also given in Houben-Weyl, Volume E3, 128. The information contained in these and later-cited references is hereby incorporated by reference.

As described above in the case of tetramethoxypropane and reaction thereof with higher alcohols with elimination of methanol, the X-substituted malonaldehyde methyl or ethyl acetals can be transacetalized analogously. After removal of the methanol or ethanol by distillation, the mostly oily residue can be employed directly.

Other suitable acetals are derivatives of 1,3-diformylacetone which can be enolized twice and is likewise readily soluble in aqueous alkali. The synthesis leads from diformylacetone (in accordance with *J. Indian Chem. Soc.* 26: 568) or via 4-pyrone directly to the 1,1,3,3,5,5-hexaethyl acetal (*Berichte* 38 (1905): 1469). The hexamethyl acetal of diformylacetone (pentan-3-one-1,5-dial), which is particularly suitable for transacetalization using higher alcohols, is prepared analogously via pyrone.

The products of the abovementioned formula II containing more than 3 carbon atoms in the radical R can be distilled only with difficulty and are therefore employed directly in the radiation-sensitive solution.

The cleavable compounds can be employed individually, mixed with one another and also in combination with known acid-cleavable compounds. It is also possible to replace up to about 30% of the alcohol component by diols in the transacetalization. Besides monomeric acetals, oligomeric to polymeric acetals of the dialdehydes employed are also produced here, which result in higher viscosity of the products. Diol contents of greater than about 50% result in crosslinked polyacetals and thus in gelling and development problems.

For production of the positive radiation-sensitive mixtures according to the invention, the acetals described are mixed with substances which form acids photochemically and/or through the action of high-energy radiation, particularly electron or X-ray radiation. The addition of an acid former is not necessary in the electron beam imaging of halomalonaldehyde tetraacetals since these compounds have both functions.

The mixtures furthermore contain a polymeric binder which is insoluble in water, but soluble in organic solvents. Since aqueous-alkaline solutions are advantageously employed as developer liquids for the exposed copying coatings, and since they are generally preferred over developers based on organic solvents, binders are used which are soluble or at least swellable in aqueous alkalis.

The type and quantity of the water-insoluble binders can vary depending on the purpose of use; proportions of the total solids content of between about 30 and 80, particularly preferably about 50–75, % by weight are preferred.

The phenolic resins, above all novolaks, which have proven successful in many positive copying materials have also proven particularly advantageous here. The novolaks can also be modified in a known manner by reacting some of their hydroxyl groups, for example with chloroacetic acid, isocyanates, epoxides or carboxylic anhydrides. Other alkali-soluble resins, such as copolymers of maleic anhydride and styrene, vinyl acetate and crotonic acid, methyl methacrylate and methacrylic acid and alike are likewise suitable as binders. Copolymers of (meth)acrylates containing free phenolic OH groups, and homopolymers or copolymers of vinylphenols can also be used.

In addition, it is possible to use concomitantly numerous other resins, which are either water-soluble or which alternatively, are alkali-insoluble, for example polyvinyl acetates, polyurethanes, polyacrylates, polyvinyl ethers and polyvinyl pyrrolidones, which may themselves be modified by comonomers, and also hydrogenated or partly hydrogenated colophonium derivatives. The most favorable proportion of these resins depends on the applicational requirements and on the effect on the development conditions and is generally not more than about 20% by weight of the alkali-soluble resin. For specific requirements, such as flexibility, adhesion and gloss, the photosensitive coating may additionally contain small amounts of further substances, such as polyglycols, cellulose ethers, for example ethylcellulose, wetting agents and finely dispersed pigments.

Suitable radiation-sensitive components which form or eliminate preferably strong acids on irradiation include a large number of known compounds and mixtures, such as diazonium, phosphonium, sulfonium and iodonium salts, halogen-containing compounds, o-quinonediazide-sulfochlorides and organometallic/organohalogen combinations.

Suitable diazonium salts are the compounds known in the diazotype field having a utilizable absorption between 300 and 600 nm. Preferred compounds are those containing no basic substituents.

The -onium salts mentioned are generally employed in the form of the salts which are soluble in organic solvents, mostly as deposition products with complex acids, such as tetrafluoroboric acid, hexafluorophosphoric acid, hexafluoroantimonic acid and hexafluoroarsenic acid.

In principle, all organohalogen compounds which are also known as free-radical photochemical initiators can be used as halogen-containing, radiation-sensitive compounds which form hydrohalic acid, for example those having more than one halogen atom on a carbon atom or on an aromatic ring. Examples are described in U.S. Pat. Nos. 3,515,552, 3,536,489 and 3,779,778, German Auslegeschrift No. 2,610,842 and German Offenlegungsschriften Nos. 2,718,259 and 2,243,621.

The amount of acid donor can likewise vary considerably depending on its chemical nature and on the composition of the mixture. Favorable results are obtained using about 0.1 to 10% by weight, relative to the total solids, and about 0.2 to 5% are preferred. Particularly for copying coatings of thicknesses greater than about 10 $\mu$m, it is advisable to use relatively little acid donor.

Finally, soluble or fine particulate, dispersible dyes and also, depending on the application, UV absorbers can be added to the photosensitive mixture. Dyes which have proven particularly successful are the triphenylmethane dyes, in particular in the form of their carbinol bases. The polymethine dyes described in European Patent Application No. 224,161 are preferred for increasing the image contrast after exposure.

Suitable solvents for the substance mixture according to the invention are ketones, such as methyl ethyl ketone; chlorinated hydrocarbons, such as trichloroethylene and 1,1,1-trichloroethane, alcohols, such as n-propanol, ethers, such as tetrahydrofuran, alcohol ethers, such as propylene glycol monoethyl ether, and esters, such as butyl acetate or 1-ethoxy-prop-2-yl acetate. It is also possible to use mixtures which may additionally contain, for specific purposes, solvents, such as acetonitrile, dioxane or dimethylformamide. In principle, all solvents which do not react irreversibly with the coating components can be used.

The choice of solvent should be matched to the coating method proposed, the coating thickness and the drying apparatus. Experimental amounts of thin coatings up to about 5 $\mu$m are preferably applied by spin casting. Using solutions having a solids content of up to about 40%, coating thicknesses of more than 60 $\mu$m can thus be achieved with a single application or by using a coating doctor. Dip coating is preferred for two-sided coating, it being possible to achieve rapid drying by using low-boiling solvents. Tape coating takes place by means of rolls, a slot dies or spraying; individual plates can be coated by means of a certain coater.

Preferred substrates for coatings of thickness greater than about 10 $\mu$m are plastic films, which then serve as temporary substrates for transfer coatings.

For these and for color proofing films, polyester films are preferred. In most cases, metals are used as the coating substrates for coating thicknesses of less than about 10 $\mu$m. The following can be employed for offset printing plates: mechanically or electrochemically roughened and optionally anodized aluminum, which may in addition be chemically pretreated, for example with polyvinylphosphonic acid, silicates or phosphates, in addition multimetal plates having Cu/Cr or brass/Cr as the uppermost metal layer. The coatings according to the invention are suitable for rotogravure or screen printing forms due to their good adhesion and etch resistance on copper or nickel surfaces. The mixtures according to the invention can likewise be used as photoresists, for which they are particularly suited due to their good stability in solution.

Coating can be carried out directly or by dry coating transfer from the temporary substrate onto circuit board materials that comprise insulating plates with a copper coating on one or both sides, onto glass or ceramic materials that are optionally pre-treated with an adhesion promoter, and onto wafers made of silicon, silicon oxide or silicon nitride.

For drying the applied coating, the customary equipment and conditions can be employed, temperatures of around 100° C. and, for a short time, up to 120° C. being withstood without loss of radiation sensitivity.

For exposure of the image, customary light sources, such as fluorescent tubes, pulsed xenon lamps, high-pressure mercury vapor lamps doped with metal halide, and carbon arc lamps can be used. Exposure can also take place using the coherent light of a laser. For purposes of the present invention, short-wave lasers of appropriate power, for example argon lasers, krypton ion lasers, dye lasers and helium/cadmium lasers, which emit between 300 and 600 nm are suitable. The laser beam is directed by means of digital data to expose a dot or line image.

A further way of producing an image is irradiation using electron beams. Electron beams are able to thoroughly decompose and crosslink the mixture according to the invention, as well as many other organic materials, so that a negative image is produced when the unexposed areas are removed by solvent or by exposure without original and development. If the intensity of the electron beam is reduced and/or the writing speed is increased the electron beam, in contrast, causes differentiation towards higher solubility, i.e. the exposed areas of the coating can be removed by the developer.

The coating which has been imagewise exposed or irradiated can be removed using the same developers as for known coatings based on acid-cleavable compounds, or the copying conditions for the novel coatings can advantageously be matched to the known auxiliaries, such as developers and programmed spray-developing equipment. The aqueous developer solutions may contain, for example, phosphates, silicates or hydroxides of alkali metals and furthermore wetting agents and relatively small amounts of organic solvents. In certain cases, solvent/water mixtures can also be used as developers. The choice of the most favorable developer can be determined by trials using the coating used in each case. If necessary, the development can be mechanically assisted.

In order to increase the durability during printing and the resistance to washout agents, correcting agents and printing inks which can be hardened by UV light, the developed plates can be heated briefly to elevated temperatures, as is known from British Patent No. 1,154,749 for diazo coatings. Image reversal by the method of European Patent Application No. 82,463 is also possible.

The invention also provides a relief image production process in which a radiation-sensitive recording material comprising a coating substrate and a radiation-sensitive recording coating comprising the above-defined, radiation-sensitive mixture is irradiated imagewise using actinic radiation in a dose such that the solubility of the coating in a liquid developer increases, and the irradiated areas of the coating are washed out using an aqueous-alkaline developer solution.

In Table I below, data are given for the preparation of a number of tetraacetals of the formula I. As stated above, the preparation takes place analogously to known procedures. The starting material employed is 1,1,3,3-tetramethoxypropane (TMP) of boiling point (b.p.) 183° C. for compounds 1 to 8 and 10 and tetraethoxyethane for compound 9.

The acetal is reacted with the alcohol HOR given in the second column at 60°–180° C., and the methanol or ethanol produced is removed by distillation. In the case of compounds 1–4 and 8–10, it was possible to distill the product obtained, and, in the case of compounds 5–7, the distillation residue obtained under the stated conditions was used. The transacetalization was carried out in the presence of about 10% of catalyst K 10.

The novel tetraacetals which are described in Table I are numbered in sequence and appear again with the same numbers in the Examples. In the Examples, the amounts are usually given in parts by weight (pbw). Percentage and mixing ratios should be taken as units by weight.

TABLE I

| Compound No. | Alcohol HOR | b.p. °C. | Number of moles employed HOR | Number of moles employed acetal (TMP) | Removal of CH$_3$OH by distillation % | Removal of CH$_3$OH by distillation after hours | Product distillation vacuum (mbar) | Product distillation b.p. °C. |
|---|---|---|---|---|---|---|---|---|
| 1 | 2-Methoxy-ethanol | 124.5 | 6 | 0.75 | 73 | 3 | 0.27 | 135–138 |
|   |   |   |   |   | 98 | 5 |   |   |
| 2 | 2-Ethoxy-ethanol | 135–137 | 3.6 | 0.75 | 90 | 1 | 0.27 | 150–155 |
| 3 | 2-Butoxy-ethanol | 167–173 | 3.75 | 0.75 | 85 | 3 | 0.07 | 180–185 |
| 4 | 2-Ethyl-butanol | 146–150 | 3.75 | 0.75 | 91 | 3 | 0.07 | 146–147 |
| 5 | 2-Phenoxy-ethanol | 237 | 2.15 | 0.43 | 71 | 4 | Flask residue after distilling off to 0.13 | 200 |
| 6 | Benzyl alcohol | 205 | 0.5 | 0.1 | 79 | 1 | Residue after distilling off to 0.11 | 100 |
| 7 | 2-(2-Butoxy-ethoxy) ethanol | 226–234 | 2.0 | 0.4 | 77 | 3 | Residue as in No. 5 |   |
| 8 | 2-(2-Methoxy-ethoxy) ethanol | 190–196 | 2.5 | 0.5 | 75 | 2 | 0.04 | 200–205 |
| 9 | 2-(2-Methoxy-ethoxy) ethanol | 190-196 | 2.0 | 0.4 (TEE) | 80 | 4 | 0.13 | 195–205 |
| 10 | 2-(2-Ethoxy-ethoxy) ethanol | 190–204 | 2.5 | 0.5 | 83 | 1.5 | 0.03 | 207–215 |

| Compound No. | Analysis C calc. | Analysis C found | Analysis H calc. | Analysis H found | Appearance |
|---|---|---|---|---|---|
| 1 | 52.9 | 52.8 | 9.4 | 9.8 | colorless liquid |
| 2 |   |   |   |   | colorless liquid |
| 3 | 63.8 | 63.8 | 11.0 | 11.6 | pale yellow liquid |
| 4 | 72.9 | 73.1 | 12.6 | 13.3 | colorless liquid |

TABLE I-continued

| | | | | | |
|---|---|---|---|---|---|
| 5 | 71.4 | 72.1 | 6.8 | 7.1 | dark brown viscous liquid |
| 6 | 79.5 | 79.2 | 6.8 | 7.1 | dark brown viscous liquid |
| 7 | 61.4 | 61.2 | 10.5 | 10.8 | dark brown viscous liquid |
| 8 | 53.5 | 54.0 | 9.3 | 9.7 | pale yellow oily liquid |
| 9 | 54.3 | 52.7 | 6.2 | 9.6 | pale yellow oily liquid |
| 10 | 56.6 | 57.0 | 9.8 | 10.2 | pale yellow oily liquid |

EXAMPLE 1

To produce an offset printing plate, a coating solution comprising

| 7.6 pbw | of a cresol-formaldehyde novolak having a softening range of 105–120° C. in accordance with DIN 53181, |
|---|---|
| 2.0 pbw | of compound No. 4, |
| 0.3 pbw | of 2-(4-methoxyanthrac-1-yl)-4,6-bistrichloro-methyl-s-triazine and |
| 0.1 pbw | of 4-diethylaminoazobenzene in |
| 90.0 pbw | of 1-ethoxy-2-propyl acetate | was applied to wire-brushed aluminum by means of roll application.

The solution is subsequently dried to form a homogeneous coating having a coating weight of 2.2 g/m², corresponding to a thickness of about 2 μm.

After drying, the coating is exposed under a positive original, developed using a 3.5% strength aqueous solution of trisodium phosphate which has been adjusted to a pH of 12.6 by addition of sodium hydroxide, then washed with water and finally prepared for printing by wiping with 1% strength phosphoric acid. This plate exhibits rapid take-up of the printing ink and sharp image reproduction.

For comparison, a corresponding offset printing plate is produced in which compound No. 4 is replaced by the same amount of the bis-2-tetrahydropyranyl ether of 4,4'-isopropylidenediphenol. This compound is known from German Patent No. 2,306,248.

With the same coating thickness, drying and exposure conditions and developer solution, the coating according to the invention can be developed in 60 seconds about 5 minutes after exposure, whereas the comparison coating requires 100 seconds. The continuous tone step wedge that was also copied, having a density difference of √2 per step, shows that the comparison coating is about 1–2 wedge steps less sensitive. After waiting for more than 3 hours between exposure and development and at a relative atmospheric humidity of 55%, the development times are 30 seconds and 80 seconds for the comparison coating; the wedge step difference is 4 steps. The differences are even greater if compound No. 4 is replaced by compound No. 5 from the table.

EXAMPLE 2

To produce a positive dry resist for etching and electroplating applications, the following solution is prepared:

| 55 pbw | of butanone, |
|---|---|
| 24.5 pbw | of the novolak as in Example 1, |
| 20 pbw | of compound No. 5, |
| 0.3 pbw | of 2-(4-ethoxyethoxynaphth-1-yl)-4,6-bistrichloromethyl-s-triazine and |
| 0.2 pbw | of Crystal Violet. |

Using this solution, a biaxially stretched and thermoset, 25 μm thick, polyethylene terephthalate film which has been pre-treated with trichloroacetic acid/polyvinyl alcohol is coated and dried in a manner such that a uniform resist coating of approximate thickness 25 μm is produced. The surface of the resist coating is laminated using a 12 μm thick polyethylene film.

After removal of the protective film, bare brass sheets are laminated on both sides with this coating under pressure and heat in a commercially available laminator, in order to produce contact springs for switches. After cooling, removing the base film and brief post-drying in a drying oven at 80° C., the coated sheet is exposed on both sides using a congruent pair of originals; good image contrast is produced. The exposed sheet is subsequently developed at the decolored, exposed areas by spraying on both sides with a solution of

| 0.5% of NaOH, |
|---|
| 0.8% of sodium metasilicate × 9 H₂O and |
| 1.0% of 2-n-butoxyethanol in |
| 97.7% of demineralized water, | and rinsed, and the plates are etched in the chemical milling process using commercially available ferric chloride solution until they have been etched through to form smooth edges. Before separation, the chemically milled parts produced as a group can be processed further, for example by subjecting them to a second exposure and development and by gold-plating the contact ends, bending them into the desired shape and stripping.

Compared with a 25 μm thick, commercially available positive dry resist, the material according to the invention is less brittle and therefore can be processed on this mobile and flexible substrate without cracking. The relatively high flexibility of the coating is achieved by the fact that, at an acetal content of about 40–50% of the total solids content, compared with about 20% in the case of customary acetals, it has the most favorable potential for development and overdevelopment resistance.

If compound No. 5 is replaced in this example by the same amount (44.4%, relative to the solids) of the known polyacetal made from 2-ethylbutyraldehyde and triethylene glycol, the unexposed image mask is attacked during development before development of the exposed coating areas is complete. Even using a developer which has been diluted with water in the ratio 1:1 or greater, the image areas are vigorously attacked immediately after dissolution of the exposed areas, meaning that adequate image differentiation is not possible.

EXAMPLE 3

The example shows the use of a hexaacetal in a coating solution for roller coating in the production of fine-line circuit boards. The 1,1,3,3,5,5-hexamethyl acetal of diformylacetone used is prepared analogously to the ethyl acetal described in Ber. 38; (1905), 1469, from pyrone, methyl orthoformate and methanol, and subjected to fractional distillation. It has a b.p. of 70° C. at 0.33 mbar.

Elemental analysis $C_{11}H_{24}O_6$: calc.: 52.4% C, 9.5% H, found: 52.7% C, 10.0% H.

The hexamethyl acetal is also highly suitable as the starting material for transacetalization.

The following coating components:

| | |
|---|---|
| 65 pbw | of the novolak as in Example 1, |
| 7.5 pbw | of polyvinyl methyl ether (Lutonal M 40), |
| 27 pbw | of the above mentioned hexamethyl acetal, |
| 0.4 pbw | of 2-acenaphth-5-yl-4,6-bistrichloromethyl-s-triazine and |
| 0.1 pbw | of Crystal Violet Base, | are dissolved in 1-methoxypropan-2-ol to give a solution containing 30% of solids. A coating solution having a viscosity of about 90 mPas is obtained. The corresponding solution containing 40% of solids has a viscosity of approximately 200 mPas.

On application of this solution to through-plated, copper-coated insulating plates by means of roller coating, for example using a commercially available roller coater, type AKL 400 for two-sided coating, which is equipped with rubber serrated rolls having 48 or 64 grooves per 2.5 cm (linear), supplied by Messrs. Buerkle, Freudenstadt, Federal Republic of Germany, dry coating thicknesses of about 3 to 14 μm, depending on the resist solution, the serrated roll and the machine setting, can be obtained by means of a single coating.

After drying, the plate is exposed firstly under a negative original which is transparent in the hole areas, these areas are then washed out using the developer specified in Example 2, and the plate is dried for 10 minutes at 80° C., electroplated with copper at the bared hole areas and tin-plated. The photoresist coating is then exposed under a positive conductor track original and developed as above. The bared copper is removed by etching with an alkaline etchant.

Similar results are obtained when the cleavable acetal used is the corresponding hexaethyl compound.

If the substance obtained by transacetalization using 2-ethoxyethanol and removal of about 70% of the theoretical amount of methanol by distillation is employed, the ideal amount to be employed, relative to the total solids content, is about 35–40% instead of the above-mentioned 27%. In addition, the coating thereby becomes softer and more flexible.

EXAMPLE 4

In this example, it is intended to demonstrate and compare some differences between various acetals. For this purpose, fine-line circuit patterns are applied to silicon wafers using the following positive photoresist solution:

| | |
|---|---|
| 76 pbw | of 1-methoxypropan-2-ol, |
| 14 pbw | of the novolak as in Example 1, |
| 3 pbw | of polyvinyl ethyl ether (Lutonal A 25), |
| 1 pbw | of 2-(6-methoxynaphth-2-yl)-4,6-bistrichloro-methyl-s-triazine, and |
| 6 pbw | of acetal. |

After spin-coating this solution at 6,000 rpm and subsequent drying in a circulation drying oven, a storage-stable, positively pre-sensitized wafer of increased photosensitivity, compared with commercially available positive photoresist coatings based on o-naphthoquinonediazide, for example the commercially available AZ 1350J, is obtained.

If the acetal employed is compound 8 from the table, a clean image can be developed in a maximum of 2 minutes using the relevant commercially available aqueous-alkaline (AZ) developer. In the case of over-development, i.e. when testing the developer resistance in order to assess the image differentiation, dissolution of the unexposed areas of the coating begins after about 5 minutes.

If the acetal employed is commercially available 1,1,2,2-tetraethoxyethane, a positive image of the original is obtained after development for about 1 minute, but with rapid image attack, i.e. low overdevelopment resistance. The development time until the appearance of a positive image is about 10 minutes using compound 9 from the table, prepared therefrom by transacetalization, and the overdevelopment resistance is between 10 and 15 minutes. If compounds 8 and 9 are compared directly, 8 is clearly better.

If the cleavable acetals employed are C5-derivatives of 1,1,5,5-tetraethoxypentane and 1,1,5,5-tetra-n-butoxypentane, prepared by the procedure in J. Chem. Soc. 1951: 2480, in place of the above C2- and C3-dialdehyde derivatives, these coatings can be developed in about 5 or about 7 minutes with good overdevelopment resistance. If drying is shorter than usual, the development time is reduced at the expense of resistance, and if the drying is longer the development time is increased so that the developer has to be strengthened, for example using sodium hydroxide solution.

Finally, the commercially available C6-derivative adipaldehyde tetraethyl acetal was tested in this coating and could also be developed to a positive image within 8 minutes. Again, this did not reach the quality of compound 8 or compound 9.

EXAMPLE 5

A glass plate with a conductive transparent ITO (indium tin oxide) coating applied by sputtering for the production of liquid crystal display elements (LCD) is coated by means of a roller coater with a non-photosensitive, but electron-beam-sensitive coating of the following coating solution:

| | |
|---|---|
| 60 pbw | of a copolymer of 4-hydroxystyrene and hexyl methacrylate (OH number 290, RSV |

-continued

|  |  |
|---|---|
|  | value 0.55 dl/g in dimethylformamide), |
| 19 pbw | of bromoacetal, |
| 0.5 pbw | of Solvent Blue 5 (CI 61554), |
| 0.5 pbw | of Crystal Violet Base, and |
| 120 pbw | of 1-methoxypropan-2-ol. |

After drying, the coating is about 5 μm thick.

The essential component here is the halogen-containing acetal compound, from which the hydrohalic acid is produced on electron bombardment; the latter hydrolyzes the acetal groups catalytically.

The first bromoacetal used is prepared by bromination of commercially available malonaldehyde bis-dimethyl acetal (1,1,3,3-tetramethoxypropane) by the method of Chem. Ber. 93: 268 (1960). In this procedure, the enol form of the dialdehyde is produced, corresponding to 1,1,3-trimethoxy-2-bromoprop-2-ene; calc. 37.9, found 37.6% Br. From this compound, a further bromoacetal is obtained by transacetalization using 2-ethoxyethanol and is employed as the fraction of b.p.=98° C. at 0.31 mbar.

Analysis: found 29.8% Br, calc. 29.8% Br. For comparison, compound 2 from the table, tetraethoxyethoxypropane, is brominated (found 34.7% Br), and this substance is likewise employed in the photoresist solution above.

The coating is irradiated with 10 kV electrons until the color has disappeared virtually completely and the future conductor tracks are already readily visible. The image with the first bromoacetal can be developed in 20 seconds in 1% sodium hydroxide solution on irradiation of an area of 10 cm$^2$ for 1 minute at a beam current of 10 μA. At significantly higher energy densities, the irradiated areas crosslink and give a negative image with about 4% strength sodium hydroxide solution as developer.

The second bromoacetal of the brominated transacetalization product gives a coating which can be developed with good differentiation in two minutes on irradiation for at least 40 seconds per 10 cm$^2$. On irradiation with UV light, neither coating gives an image. If, as in the other examples, a photoinitiator, for example a bis-trichloromethyltriazine, is added to the coating solution, both coatings exhibit UV photosensitivity in addition to, as expected, somewhat increased electron beam sensitivity.

After etching the ITO at the bared areas using 5% strength hydrochloric acid and developing using 5% strength potassium hydroxide solution, the plate is ready, for example, for a 7-segment numerical display. The blue basic coloring serves to increase the image contrast before etching.

The starting material of this example, formulated in the enol form as 2-bromo-1,1,3-trimethoxy-2-propene, can be converted into 2-hydroxymalonaldehyde tetraethyl acetal by reaction with Na- alkoxides, for example sodium ethoxide, by the method described in CA 84: 164169 x (1976) or CA 85: 20550 (1976). This compound and 2-methoxymalonaldehyde tetraethyl acetal, prepared by the method of Chem. Ber. 96: 2664 (1963), only give electron and UV sensitivity in the above recipe when a photoinitiator is added, but the overdevelopment resistance is less than in the case of acetals having a larger alcohol radical.

EXAMPLE 6

In order to produce autotypical rotogravure cylinders, positive photoresist solutions of the following composition

|  |  |
|---|---|
| 40 pbw | of trichloroethane, |
| 40 pbw | of 1-methoxypropan-2-ol, |
| 5 pbw | of acetal, |
| 14.5 pbw | of the novolak as in Example 1, |
| 0.3 pbw | of 2-(4-styrylphenyl)-4,6-bistrichloromethyl-s-triazine and |
| 0.2 pbw | of Crystal Violet Base | are applied uniformly in a thickness of about 6 μm by spraying using a compressed-air pistol onto a rotating copper cylinder, the coating is dried using IR irradiation with the cylinder rotating, exposed under a negative autotypical rotogravure film and developed in aqueous-alkaline solution. At the areas between the cell walls which have been developed with variable area corresponding to the original, the cells are etched with variable area and depth using ferric chloride solution. Before completion for printing, the resist stencil is stripped by means of alkaline solution and the cylinder is chromium-plated.

A mixture of cleavable compounds containing oligomeric acetals is also used to produce a highly adherent positive photoresist which can be retouched. During the transacetalization of 1,1,3,3-tetramethoxypropane using triethylene glycol in the molar ratio 1:2 and removal of the liberated methanol by distillation, an increasing amount of highly viscous to rubbery condensation products is formed which, when added to the following resist formulation in an amount of 25%, relative to the solids content, produce increasingly softer through tacky and finally no longer soluble coatings which are also slower to develop.

Furthermore, tetramethoxypropane is transacetalized using 2-n-butoxyethanol and triethylene glycol in the molar ratio 1:1:1 with acidic catalysis, the methanol liberated is removed by distillation, and the mixture which remains is stirred with anhydrous sodium carbonate. The catalyst and sodium carbonate are removed by filtration, and the viscous substance is concentrated further in a rotary evaporator in vacuo at the water-bath temperature.

The coating obtained using the last-mentioned acetal is developed cleanly by pouring 1.5% strength sodium hydroxide solution onto the rotating cylinder and is then etched. If the coating is treated mechanically, for example by drawing a line with a grader, its edges hardly break up at all, in contrast to the naphthoquinonediazide-based photoresists usually used. Approximately similar results are obtained when the less viscous compound 3 from the table is employed in place of this mixed acetal.

EXAMPLE 7

For the production of offset printing plates, aluminum foils having an electrolytically roughened and anodized surface are spin-coated with photosensitive solutions of the following basic recipe:

|  |  |
|---|---|
| 7.5 pbw | of the novolak as in Example 1, |
| 2.3 pbw | of acetal, |
| 0.15 pbw | of 2-(4,7-dimethoxynaphth-1-yl)-4,6-bistrichloromethyl-s-triazine and |
| 0.05 pbw | of Crystal Violet Base in |

-continued 90 pbw of 1-ethoxypropan-2-ol.

After drying, the coatings (coating weight about 2.5 g/m²) are exposed under a positive test original, developed as in Example 1 and prepared for printing. A further sample is processed from each printing plate in the same way, but heated to 90° C. for 10 minutes before development. The development time, the length of the continuous tone wedge and the print run achievable are compared.

Three cleavable substances are employed which are prepared from 4-pyrone analogously to the hexaethyl acetal of diformylacetone employed in Example 3. The pyrone is reacted once with 2-phenoxyethanol and once with polyethylene glycol monomethyl ether containing 6–8 ethylene oxide units. In addition, tetramethoxypropane (TMP) is reacted with the polyglycol derivative specified in order to prepare the third substance.

In the first synthesis, 0.015 mol of pyrone and 0.15 mol of 2-phenoxyethanol are stirred in 0.05 mol of ethyl orthoformate containing a small drop of concentrated sulfuric acid, and the mixture is allowed to stand for 5 days at room temperature. A parallel batch in the molar ratio 1:6 is processed in the same way, and a further batch in the molar ratio 1:10 is refluxed for 1 hour. All the mixtures are subsequently neutralized using a slight excess of sodium ethoxide, and the volatile components are evaporated in an oil pump vacuum; the residue is weighed, and the hexaacetal or tetraacetal yield is calculated, relative to the pyrone employed or the polyglycol methyl ether. The third product is prepared as usual by transacetalization with removal of the methanol by distillation. All the substances are yellow-brown viscous oils. The results obtained therewith are shown in the following summary:

| | Residue (%) | Development time (sec.) unheated | Development time (sec.) heated | Wedge steps unheated | free heated |
|---|---|---|---|---|---|
| 1. pyrone + phenoxyethanol | | | | | |
| (a) 1:10, RT, 5 days | >100 | 15 | 90 | 11 | 6 |
| (b) 1:6, RT, 5 days | 64 | 20 | 120 | 11 | 9 |
| (c) 1:10, 1h reflux | >100 | 8 | 15 | 11 | 10 |
| 2. pyrone + polyethylene glycol methyl ether 1:6, RT, 5 days | 92 | 60 | 600 | 7 | 10 |
| 3. TMP + polyethylene glycol methyl ether 1:4, 1h reflux | 87 | 180 | 360 | 1 | 2 |

All the above coatings exhibit adequate to good overdevelopment resistance. The hexaacetal products with phenoxyethanol are obviously the most photosensitive, and, in addition, they accept ink better and exhibit longer print runs in the printing experiment than coatings with substances 2 and 3.

EXAMPLE 8

Positive color grouping films are produced, for example for checking the mounting in multicolor offset printing. For this purpose, the cleavable compound employed is the transacetalization product of tetramethoxypropane ($n_D=1.407$) and 1-methoxypropan-2-ol ($n_D=1.403$), which is also used as the solvent.

In the synthesis, this mixture is refluxed in the molar ratio 1:4 with addition of p-toluenesulfonic acid as catalyst. The methanol produced during the transacetalization, and then the unreacted components, are removed by distillation via a column. The major fraction of the product of refractive index $n_D=1.448$ is obtained at 0.4 mbar and about 127° C. This corresponds to about 15%, relative to the TMP employed, and is employed as follows.

The copying coatings have the composition:

| | | |
|---|---|---|
| 30 pbw | of the above tetraacetal, | |
| 48 pbw | of the novolak as in Example 1, | |
| 20 pbw | of a colophonium derivative of the alkyd resin type (Neolyn ® 20 from Hercules Inc.), | |
| 0.5 pbw | of 2,5-diethoxy-4-p-tolyl-mercapto-benzenediazonium hexafluorophosphate, | |
| 1.5 pbw | of Zapon Fast Blue HFL (C.I. 2880) or | |
| 1.2 pbw | of Zapon Fast Red BB (C.I. 2864) or | |
| 2.0 pbw | of Fat Yellow 5 G (C.I. Suppl. 572). | |

The coating thicknesses between 1 and 3 μm and the amounts of dye are matched to one another so that the red, blue and yellow foils have the same photosensitivity, i.e. produce equally long wedge steps on a continuous tone test wedge at both the same exposure time and the same development time using 0.6% strength sodium hydroxide solution. These scratchproof color proofing films are more than twice as photosensitive as comparison products based on o-naphthoquinone diazides.

EXAMPLE 9

This example shows the use of a 15 μm thick positive dry resist coating for the etching of conductor tracks on multilayer internal layers. For this purpose, a cleavable tetraacetal is employed which was prepared as follows:

2-Methoxycarbonylmalonaldehyde (=methyldiformyl acetate) was firstly synthesized analogously to *J. Am. Soc.* 95: 543 (1973) from methyl 3,3-dimethoxypropionate, prepared by the method of *J. Am. Chem. Soc.* 71: 1257 (1949). The procedure was modified by carrying out the formylation in t-butyl methyl ether instead of in dry diethyl ether and working under nitrogen instead of under argon. The pale-yellow, oily liquid obtained exhibits the IR bands specified.

To prepare the tetraacetal desired, 2-methoxycarbonylmalonaldehyde is converted into the acetal via the methyl acetal using 2-phenoxyethanol in a one-pot reaction. To this purpose, 0.1 mol=13.0 g of 2-methoxycarbonylmalonaldehyde, 0.22 mol of trimethyl orthoformate and 0.4 mol of 2-phenoxyethanol are stirred in a flask, and about 0.2 g of K 10 catalyst or p-toluenesulfonic acid are added to this mixture while heating gently. As the temperature slowly increases, firstly methyl formate (b.p. 31° C.) and then a methyl formate/methanol mixture pass over, and the remainder is distilled off in vacuo up to 100° C. and 1.3 mbar. The yellow oil which remains is employed directly.

A coating solution of

| | |
|---|---|
| 19 g | of this oily tetraacetal, |
| 25.5 g | of the novolak as in Example 1, |
| 0.2 g | of 2-(4-styrylphenyl)-4,6-bistrichloromethyl-s-triazine, |
| 0.1 g | of Solvent Blue 5 (CI 61,554), |
| 0.2 g | of Acid Violet 520 (Riedel de Haen) in |
| 55 g | of butanone | is applied to a film as described in Example 2 and dried to form an approximately 15 μm thick positive dry resist coating. After lamination onto the flexible multilayer internal layer substrates, removal of the backing film and post-drying for 5 minutes at 80° to 90° C., exposure is effected through a positive original, development is carried out within 1 minute by spraying with 1% strength sodium hydroxide solution, and the bared copper is removed by etching in an ammoniacal etching bath of pH=8.4, and the resist stencil is subsequently stripped at room temperature using 5% strength KOH.

The highly photosensitive photoresist used exhibits no cracks, and therefore no etching through, when bent on the flexible substrate, although it is based on the brittle novolak resin. The cleavable acetal compound employed acts as a plasticizer and, in the amount used in the example of 42% of the solids content, exhibits good development and resistance properties. At a lower acetal content, the development time is extended. In addition, this photoresist exhibits good image contrast both after exposure and after development on the copper base. In addition, secondary exposure and development is possible, as is negative processing by the reversal process.

Virtually the same result is obtained with a different color shade for the photoresist coating when the 0.2 g of Acid Violet 520 is replaced by 0.1 g of Crystal Violet Base.

What is claimed is:

1. A radiation-sensitive mixture, comprising:
   (a) a compound which produces a strong acid under the action of actinic radiation,
   (b) an acetal, and
   (c) a binder that is insoluble in water and soluble in organic solvents and aqueous-alkaline solutions,
wherein the acetal is a compound represented by either of formulae I and II

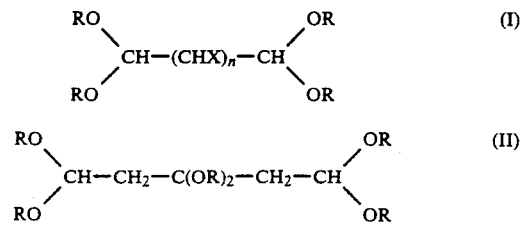

in which
R denotes a substituted or unsubstituted alkyl group,
X denotes a hydrogen or halogen atom or a hydroxyl, alkyl, alkoxy, alkoxycarbonyl, aryloxy or aryl group, and
n denotes zero or a number from 1 to 3.

2. A radiation-sensitive mixture as claimed in claim 1, wherein n is 1 or 2.

3. A radiation-sensitive mixture as claimed in claim 1, wherein, in the compound of the formula I, not more than one X is other than hydrogen.

4. A radiation-sensitive mixture as claimed in claim 1, wherein R contains 2 to 10 carbon atoms.

5. A radiation-sensitive mixture as claimed in claim 1, which contains 25 to 60% by weight, relative to its non-volatile components, of acetal.

6. A radiation-sensitive mixture as claimed in claim 1, which contains 30 to 80% by weight of binder.

7. A radiation-sensitive mixture as claimed in claim 1, which contains 0.1 to 10% by weight of a compound which produces acid on irradiation.

8. A radiation-sensitive recording material comprising a substrate and a radiation-sensitive recording coating, comprising
   (a) a compound which produces a strong acid under the action of actinic radiation,
   (b) an acetal, and
   (c) a binder that is insoluble in water and soluble in organic solvents and aqueous-alkaline solutions,
wherein the acetal is a compound represented by either of formulae I and II

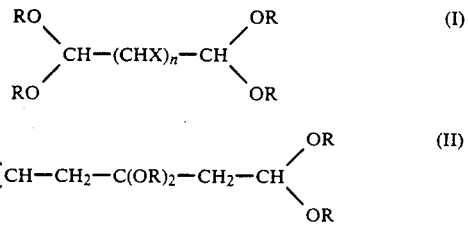

wherein
R denotes a substituted or unsubstituted alkyl group,
X denotes a hydrogen or halogen atom or a hydroxyl, alkyl, alkoxy, alkoxycarbonyl, aryloxy or aryl group, and
n denotes zero or a number from 1 to 3.

9. A process for producing relief images, comprising the steps of:
   imagewise irradiating a radiation-sensitive recording material as claimed in claim 8 with actinic radiation in a dose such that the solubility of the coating in a liquid developer increases, and
   washing out the irradiated areas of the coating by means of an aqueous-alkaline developer solution.

10. A radiation-sensitive mixture as claimed in claim 1, consisting essentially of components (a), (b), and (c).

11. A radiation-sensitive mixture, comprising:
   (a) a compound which produces a strong acid under the action of actinic radiation,
   (b) from 25–60% by weight, relative to the non-volatile components of the mixture, of an acetal, and
   (c) a binder that is insoluble in water and soluble in organic solvents and aqueous-alkaline solutions, wherein the acetal is a compound represented by formula I

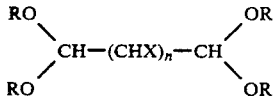

in which
R denotes a substituted or unsubstituted alkyl group,
X denotes a hydrogen or halogen atom or a hydroxyl, alkyl, alkoxy, alkoxycarbonyl, aryloxy or aryl group, and
n denotes zero or 1.

12. A radiation-sensitive mixture as claimed in claim 11, wherein n is 1.

13. A radiation-sensitive mixture as claimed in claim 11, wherein X is hydrogen.

14. A radiation-sensitive mixture as claimed in claim 11, wherein X is bromine.

15. A radiation-sensitive mixture as claimed in claim 11, wherein R contains 2 to 10 carbon atoms.

16. A radiation-sensitive mixture as claimed in claim 11, comprising about 30 to 40% by weight, relative to its non-volatile components, of acetal.

17. A radiation-sensitive mixture as claimed in claim 11, comprising about 30 to 80% by weight of binder.

18. A radiation-sensitive mixture as claimed in claim 11, comprising about 0.1 to 10% by weight of a compound which produces an acid on irradiation.

19. A radiation-sensitive material as claimed in claim 9, wherein the acetal is a compound represented by formula I and wherein the mixture contains 25–60% by weight, relative to its non-volatile components, of acetal.

20. A process for producing relief images, comprising the steps of:
imagewise irradiating a radiation-sensitive recording material as claimed in claim 19 with actinic
washing out the irradiated areas of the coating by means of an aqueous-alkaline developer solution.

21. A radiation-sensitive mixture as claimed in claim 11, consisting essentially of components a, b and c.

* * * * *